(12) United States Patent
Yoshizawa et al.

(10) Patent No.: US 7,846,615 B2
(45) Date of Patent: *Dec. 7, 2010

(54) HOLOGRAM RECORDING MATERIAL, HOLOGRAM RECORDING MEDIUM AND HOLOGRAM RECORDING METHOD

(75) Inventors: Hisae Yoshizawa, Kanagawa (JP); Jiro Minabe, Kanagawa (JP); Yasuhiro Ogasawara, Kanagawa (JP); Katsunori Kawano, Kanagawa (JP); Kazuhiro Hayashi, Kanagawa (JP); Shin Yasuda, Kanagawa (JP); Koichi Haga, Kanagawa (JP); Makoto Furuki, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 179 days.

This patent is subject to a terminal disclaimer.

(21) Appl. No.: 11/902,435

(22) Filed: Sep. 21, 2007

(65) Prior Publication Data

US 2008/0199782 A1 Aug. 21, 2008

(30) Foreign Application Priority Data

Feb. 20, 2007 (JP) ............................. 2007-039121

(51) Int. Cl.
*G03H 1/02* (2006.01)

(52) U.S. Cl. ..................... 430/1; 430/2; 430/280.1; 359/3

(58) Field of Classification Search ........................ None
See application file for complete search history.

(56) References Cited

U.S. PATENT DOCUMENTS 6,337,111 B1 1/2002 Ichihashi (Continued)

FOREIGN PATENT DOCUMENTS

CN A-1728246 2/2006

(Continued)

OTHER PUBLICATIONS

Yoshizawa et al. "Azopolymer/liquid crystal complex for polarization holograms", Jap. J. Appl. Phys., vol. 46(6B) pp. 3840-3844 (Jul. 2007 on-line).*

(Continued)

*Primary Examiner*—Martin J Angebranndt
(74) *Attorney, Agent, or Firm*—Oliff & Berridge, PLC

(57) ABSTRACT

A hologram recording material contains a molecule having intrinsic birefringence and a photoresponsive macromolecule represented by the following formula (1).

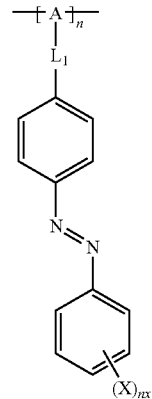

Formula (1)

in formula (1), $L_1$ representing a bivalent linking group, X representing a group having a substituent constant σ based on Hammett's rule of a value of more than 0, the maximum absorption wavelength of an azobenzene group bonding to X being approximately 360 nm or less, A representing a group that is a component of a repeating unit with a carbon number of 2 or more that is a component of a macromolecular main chain, nx representing an integer of 1 or 2, and n representing an integer of 1 or more.

14 Claims, 2 Drawing Sheets

U.S. PATENT DOCUMENTS

| | | | |
|---|---|---|---|
| 7,582,392 | B2 | 9/2009 | Yoshizawa et al. |
| 2003/0191240 | A1* | 10/2003 | Berneth et al. ............... 525/50 |
| 2004/0096776 | A1 | 5/2004 | Tanigawa et al. |
| 2004/0166424 | A1 | 8/2004 | Kaida et al. |
| 2004/0191684 | A1 | 9/2004 | Maruyama et al. |
| 2005/0068594 | A1 | 3/2005 | Tomita et al. |
| 2005/0206984 | A1 | 9/2005 | Kawano et al. |
| 2005/0208256 | A1* | 9/2005 | Yoshizawa et al. ......... 428/64.4 |
| 2005/0208387 | A1* | 9/2005 | Minabe et al. ............... 430/1 |
| 2005/0228153 | A1* | 10/2005 | Minabe et al. ............. 526/298 |
| 2005/0265134 | A1* | 12/2005 | Minabe et al. ........... 369/13.17 |
| 2006/0057467 | A1 | 3/2006 | Takizawa |
| 2007/0117027 | A1* | 5/2007 | Yoshizawa et al. ............. 430/1 |
| 2008/0013138 | A1* | 1/2008 | Yoshizawa et al. ............. 359/3 |
| 2008/0176146 | A1 | 7/2008 | Tomita et al. |
| 2008/0199782 | A1 | 8/2008 | Yoshizawa et al. |

FOREIGN PATENT DOCUMENTS

| | | | |
|---|---|---|---|
| DE | 19620588 | * | 11/1997 |
| JP | A-11-237612 | | 8/1999 |
| JP | A-11-305036 | | 11/1999 |
| JP | A-2002-265541 | | 9/2002 |
| JP | A-2003-084651 | | 3/2003 |
| JP | B2-3451319 | | 7/2003 |
| JP | A-2003-332199 | | 11/2003 |
| JP | 2005-115361 | * | 4/2005 |
| JP | A-2005-115361 | | 4/2005 |
| JP | 2007-171916 | * | 7/2007 |
| WO | WO 02/44801 A2 | | 6/2002 |
| WO | WO 2006/101003 | | 9/2006 |

OTHER PUBLICATIONS

Hvilsted et al., "azobenzene side chain liquid crystallin polyetsers with outstanding optical sotrage proeprties", Tr. J. of Chem., vol. 22 pp. 33-45 (1998).*

Helgert et al., "surface relief measurements in side chain azobenzene polyesters with different substitutewnts", Appl. Phys. B, vol. 72 pp. 429-433 (2001).*

Prescher et al., "synthesis of liquid crystalline . . . ", J. Fluor. Chem., vol. 74 pp. 185-189 (1995).*

Machine translation of JP 2005-115361.*

Table 12.10$\sigma_p°$, The 5$^{th}$ Edition Chemical Handbook Basic Book II, published by Maruzen Co., Ltd., edited by The Chemical Society of Japan, issued Feb. 20, 2004.

Yu et al., "Chiral Nematic Polymer Mixture Containing Crosslinker and Photosensitive Chiral Dopant: New Type of Materials with Tunable Photo-Optical Properties", Adv. Funct. Mater., vol. 12 No. 5, pp. 367-372 (May 2002).

Ubukata et al. "phototactic mass transport in polymer films for micropatterning and alignment of functional materials", Adv. Mater., vol. 16 No. 3, pp. 220-223 (Feb. 3, 2004).

Ubukata et al. "Surface relief grating in hybrid films composed of azobenzene polymer and liquid crystal molecule", Colloids and surfaces vol. 198-200 pp. 113-117 (2002).

Office Action dated Apr. 16, 2009-in U.S. Appl. No. 11/708,535.

Office Action dated Oct. 7, 2009-in U.S. Appl. No. 11/708,535.

Office Action dated Sep. 25, 2008-in U.S. Appl. No. 11/546,958.

Tomita et al. "volume holographic recording based on mass transpaort of nanoparticles doped in methacrylate photopolymers", Proc SPIE 5939 (9 pages) (on-line Sep. 1, 2005).

Cloutier et al., "Measurement of permanent vectoral photoinduced anisotrophy in azo-dye doped photoresist using polarization holography", J. Opt. A. Pure Appl. Opt. vol. 4 pp. S228-S234 (2002).

Tomita et al., "Organic-nanoparticle dispersed photopolymers for volume holographic reocirding", 2005 IEEE conference on lasers and electrooptics, p. 156 (Jun. 2005).

Office Action mailed Feb. 3, 2010 in U.S. Appl. No. 11/708,535.

\* cited by examiner

HOLOGRAM RECORDING MATERIAL, HOLOGRAM RECORDING MEDIUM AND HOLOGRAM RECORDING METHOD

CROSS-REFERENCE TO RELATED APPLICATION

This application is based on and claims priority under 35 USC 119 from Japanese Patent Application No. 2007-39121, filed Feb. 20, 2007.

BACKGROUND

1. Technical Field

The present invention relates to a hologram recording material utilized for recording and reproduction of information by irradiation with light, a hologram recording medium employing the same, and a hologram recording method employing the hologram recording medium.

2. Related Art

In holographic data storage, polarization of light can be recorded by selecting, as a material used for recording of hologram, a photochromic material such as a polymeric material (occasionally referred to as an 'azopolymer' hereinafter) having in a molecule an azobenzene skeleton which changes in trans-cis orientation by irradiation with light.

Further, in holographic data storage, it is important to improve recording density as well in addition to achieving high sensitivity and securing fixability of recording. While methods of improving recording density have been variously researched, a method of thickening the film thickness of a recording layer of a recording medium is known as a general method.

SUMMARY

An aspect of a hologram recording material of the present invention is characterized by containing a molecule having intrinsic birefringence and a photoresponsive macromolecule represented by the following formula (1):

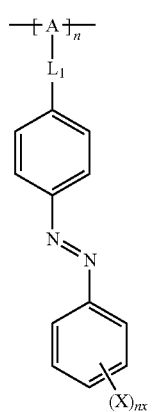

Formula (1)

in formula (1), $L_1$ representing a bivalent linking group, X representing a group having a substituent constant σ based on Hammett's rule of a value of more than 0, the maximum absorption wavelength of an azobenzene group bonding to X being approximately 360 nm or less, A representing a group that is a component of a repeating unit with a carbon number of 2 or more that is a component of a macromolecular main chain, nx representing an integer of 1 or 2, and n representing an integer of 1 or more.

BRIEF DESCRIPTION OF THE DRAWINGS

An exemplary embodiment of the present invention will be described in detail based on the following figures, wherein.

DETAILED DESCRIPTION

Figure 1:
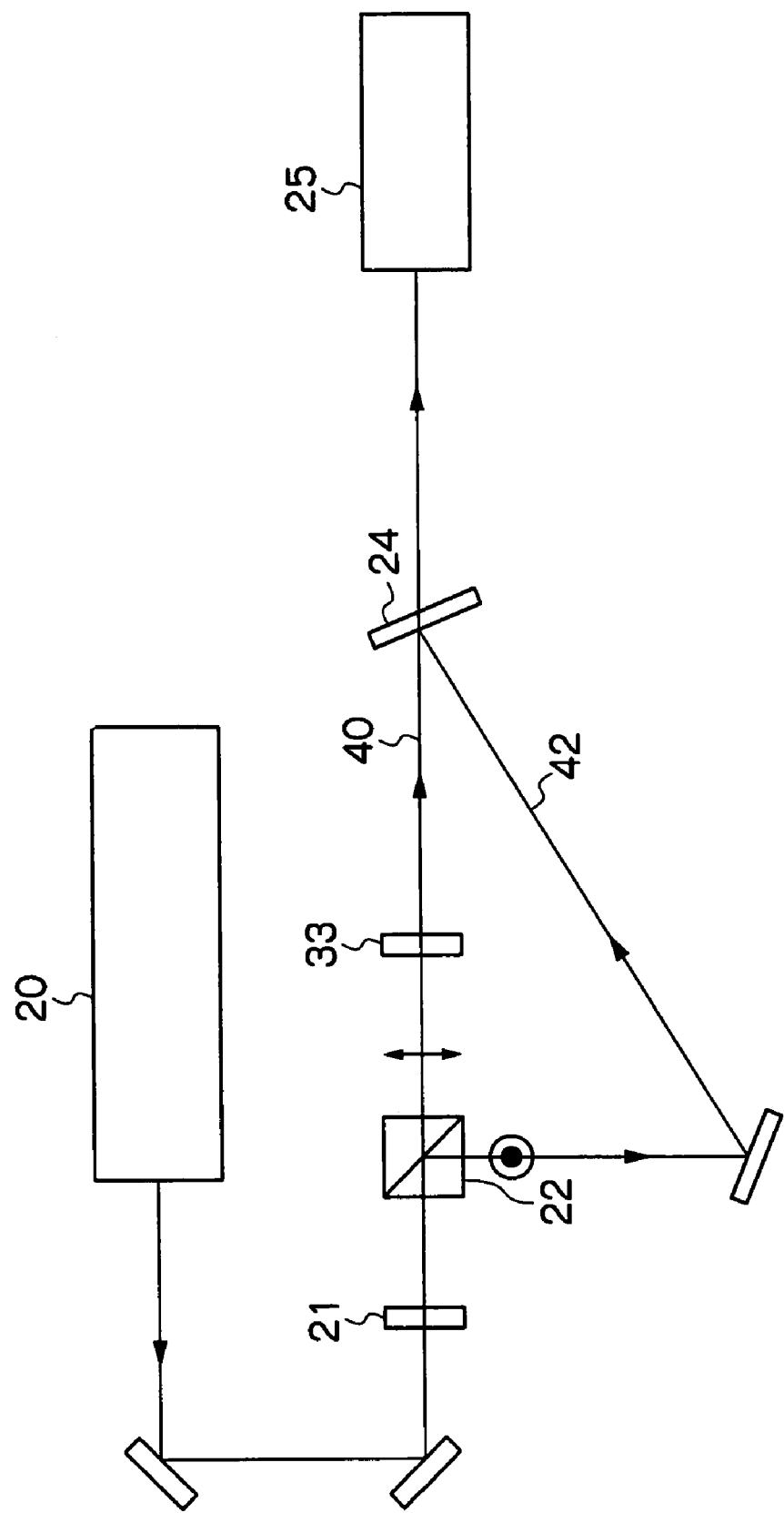
FIG. 1 is a schematic view showing one example of an optical recording reproducing device used for the present invention.

<A Hologram Recording Material and a Hologram Recording Medium>

A hologram recording material of the invention (occasionally referred to as 'a recording material' hereinafter) is characterized by containing a photoresponsive macromolecule represented by the following formula (1) and a molecule having intrinsic birefringence. A hologram recording medium of the invention (occasionally referred to as 'a recording medium' hereinafter) is characterized by containing a recording layer made of a hologram recording material of the invention.

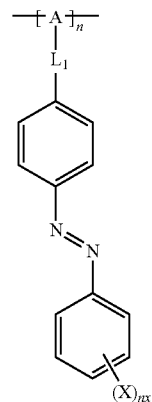

Formula (1)

In formula (1), $L_1$ represents a bivalent linking group, X represents a group having a substituent constant σ based on Hammett's rule of a value of more than 0, the maximum absorption wavelength of an azobenzene group bonding to X is 360 nm or less, A represents a group that is a component of a repeating unit with a carbon number of 2 or more that is a component of a macromolecular main chain, nx represents an integer of 1 or 2, and n represents an integer of 1 or more.

The recording of information with the use of a recording material of the invention can be performed by simultaneously irradiating with signal light and reference light. In this case, information can be recorded by utilizing modulation of at least any one characteristic selected from amplitude, phase and polarization direction of light.

The recording of information can be performed also by a multiple recording mode. Thus, the recording of information is performed particularly appropriately by utilizing modulation of polarization direction of light (in this case, however, the after-mentioned recording material of a third embodiment needs to be used as a recording material).

In addition, in the case where information is recorded by utilizing modulation of polarization direction, at least any one of the following modes can be selected: a mode in which the recording of information is performed so that polarization direction of signal light and polarization direction of reference light become parallel to each other (intensity modulation hologram), and a mode in which the recording of information is performed so that polarization direction of signal light and polarization direction of reference light become orthogonal to each other (polarization modulation hologram).

Here, in the case of performing the recording of information, the above-mentioned recording layer made of a hologram recording material is irradiated with light for recording information (such as light in a green wavelength range with a wavelength of from approximately 500 nm to approximately 550 nm), for example, Ar laser light with a wavelength of 515 nm and YAG laser light with a wavelength of 532 nm.

At least two following processes are caused in a hologram recording material by performing this light irradiation.

(1) A photoresponsive macromolecule is oriented (more specifically, a side chain having an azobenzene skeleton is oriented) (occasionally referred to as 'process (1)' hereinafter)

(2) A molecule having intrinsic birefringence is oriented in accordance with orientation of the side chain in the process (1) (occasionally referred to as 'process (2)' hereinafter)

Accordingly, in order to realize high-sensitivity record, when a photoisomerization group which composes the side chain of a photoresponsive macromolecule and exhibits isomerization reaction by irradiating with light is oriented, it is important that a molecule having intrinsic birefringence can also be oriented in response to this orientation as promptly as possible. Here, the 'photoisomerization group' signifies a portion which bonds to a main chain portion of the photoresponsive macromolecule represent ed by A, and is composed of the bivalent linking group $L_1$ bonding directly to A, the azobenzene group bonding to the opposite side of the linking group $L_1$ to the side bonding to A, and X bonding to a benzene ring composing the azobenzene group (a benzene ring on the side not bonding to the linking group $L_1$).

The inventors of the invention have earnestly studied on this point. As a result, they have found out that an X bonding to (a benzene ring located on the opposite side of a main chain side of an azo group composing an azobenzene group, among two benzene rings composing) the azobenzene group composing a photoisomerization group needs to be a group having a substituent constant σ based on Hammett's rule of a value of more than 0.

The details of this reason are unclear but yet assumed as follows. That is to say, in the case where X is a group having a substituent constant σ based on Hammett's rule of a value of more than 0, it is conceived that the interaction between a photoisomerization group and a molecule having intrinsic birefringence is improved. Thus, in the case where a photoisomerization group is oriented, it is assumed that a molecule having intrinsic birefringence can also be oriented in prompt response to orientation of the photoisomerization group.

A photoisomerization group has an azobenzene skeleton. Therefore, a photoisomerization group typically has a light absorption peak, at which absorption intensity becomes local maximum, in a shorter wavelength range than the above-mentioned green wavelength range. Thus, the shorter wavelength range a light absorption peak resulting from a photoisomerization group is located in, the more the absorption of light in a green wavelength range corresponding to the range on the longer wavelength side of the light absorption peak is restrained even though film thickness of a recording layer is thickened for improving recording density. Accordingly, in this case, utilization efficiency of light utilized for the recording of information can be improved.

Form such a viewpoint, utilization efficiency of light utilized for the recording of information is deteriorated for the reason that absorbance in approximately 500 nm or more is highly kept when the maximum absorption wavelength is more than approximately 360 nm. Therefore, the maximum absorption wavelength of an azobenzene group bonding to $L_1$ and X needs to be approximately 360 nm or less.

In this manner, in order that the absorption of light utilized for the recording of information can be restrained even though film thickness of a recording layer is thickened and high-sensitivity record can be realized, it is necessary that X composing a photoisomerization group of a photoresponsive macromolecule is a group having a substituent constant σ based on Hammett's rule of a value of more than 0 and the maximum absorption wavelength of an azobenzene group bonding to X is approximately 360 nm or less.

The maximum absorption wavelength of an azobenzene group can be controlled to approximately 360 nm or less by selecting X bonding to the azobenzene group.

Examples of X satisfying the above-mentioned conditions include —$CF_3$, —F, —Cl, —Br, —I, —$OCF_3$ and —$SCF_3$ groups. Then, among these groups, a —$CF_3$ group is preferable from the viewpoint of further restraining light absorption and intending higher sensitivity.

For reference, a substituent constant σ based on Hammett's rule of main substituents (Chemical Handbook, Basic Book, the fifth revision, Table 12.10 $\sigma_p^0$, published by Maruzen Co., Ltd., The Chemical Society of Japan) and the maximum absorption wavelength of an azobenzene group to which the above-mentioned substituents as X is bonded are shown in Table 1.

TABLE 1

| Substituents | Substituent constant σ | Maximum absorption wavelength of azobenzene group (nm) |
|---|---|---|
| —$CF_3$ | 0.505 | 355 |
| —$CH_3$ | −0.124 | 350 |
| —CN | 0.67 | 364 |
| —$NO_2$ | 0.81 | 376 |
| —H | 0 | 350 |

X can be bonded to para-position and ortho-position of a benzene ring bonding to X, particularly preferably bonded to para-position. The bonding of X to para-position of a benzene ring decreases steric hindrance in the case where a photoisomerization group and a molecule having intrinsic birefringence located in the vicinity thereof interact. Thus, the interaction between a photoisomerization group and a molecule having intrinsic birefringence can further be improved. In this case, the higher-sensitivity recording of information can be performed.

The number nx of X bonding to a benzene ring prefers to be 1 or 2, and yet particularly preferably 1 from the viewpoint of allowing steric hindrance to be further decreased.

X of a photoresponsive macromolecule represented by formula (1) is mainly described in the above, and the details of other portions (A and $L_1$) of the photoresponsive macromolecule are described later.

The use of a hologram recording material described in the above allows the absorption of light utilized for the recording of information to be restrained even though film thickness of a recording layer is thickened and high-sensitivity record to be realized. When energy is newly provided from the outside in a state through the processes (1) and (2), the oriented state of a molecule having intrinsic birefringence once oriented in a predetermined direction can be changed into another oriented state. Thus, on the occasion of the recording of information, in the case of performing only the process (1) and the process (2), a hologram recording medium of the invention can be utilized as a hologram recording medium of a rewritable type such as to allow information to be rewritten.

However, in the case of being left for a long period in a state through the processes (1) and (2), the oriented state of a molecule having intrinsic birefringence once oriented in a predetermined direction is relaxed with passage of time. Accordingly, it is difficult to retain information over a long period. Thus, the oriented state of a molecule having intrinsic birefringence oriented in a predetermined direction needs to be staticized at a point of time when the process (2) is completed (or progressed in some degree) for realizing a hologram recording medium of a write-once type such that information once recorded is semipermanently retained. Thus, a reactive molecule having intrinsic birefringence is used particularly preferably as a molecule having intrinsic birefringence. 'A reactive molecule having intrinsic birefringence' signifies a molecule such that this reactive molecule is polymerized and/or crosslinked with each other by external stimuli such as irradiation with light and application of heat. 'A molecule having intrinsic birefringence' signifies both or either of 'a nonreactive molecule having intrinsic birefringence' such as not to be polymerized and crosslinked even though external stimuli such as irradiation with light and application of heat are provided, and 'a reactive molecule having intrinsic birefringence'.

In this case, on the occasion of irradiating with light for recording information, the process (1) and the process (2) are caused as described above. Then, (3) at a point of time when the process (2) is completed (or progressed in some degree), a reactive molecule having intrinsic birefringence is polymerized and/or crosslinked with each other (occasionally referred to as 'process (3)' hereinafter), so that the oriented state of a reactive molecule having intrinsic birefringence oriented in a predetermined direction is staticized. Thus, information once recorded through the processes (1) and (2) can semipermanently be retained (fixed). In addition, after not all but only a part of reactive molecules having intrinsic birefringence in a hologram recording material existing in a region irradiated with light is oriented by onetime light irradiation, the oriented state of a reactive molecule having intrinsic birefringence is staticized, so that multiple recording can also be performed. Multiple recording can be performed by selecting intensity and time of light irradiation, and reactivity of a reactive molecule having intrinsic birefringence.

On the occasion of performing the process (3), external stimuli necessary for promoting polymerization and/or crosslinking reactions of a reactive molecule having intrinsic birefringence need to be provided. Physical, chemical or mechanical external stimuli such as irradiation with light and application of heat can be selected as these external stimuli in accordance with materials and combination thereof composing a hologram recording material.

Here, a reactive molecule having intrinsic birefringence is preferably such as to be polymerized or crosslinked by light irradiated in recording information in a recording layer. In this case, the recording and fixation of information can be performed approximately simultaneously (in the specification of the application, the case where after-treatment for fixation is unnecessary is expressed as 'the recording and fixation of information are performed approximately simultaneously'). In addition thereto, the constitution of a hologram recording device, which performs recording and reproduction of information by using this hologram recording medium, can be simplified.

Also, a substance such as to be polymerized and/or crosslinked by external stimuli except light irradiated in recording information in a recording layer can naturally be used as a reactive molecule having intrinsic birefringence as required. In this case, whether information once recorded is fixed or not can freely be selected in accordance with the importance of the recorded information. Thus, a recording medium of the above-mentioned embodiment of the invention can also be utilized as a recording medium for a rewritable type, and can serve for both needs of a rewritable type and a write-once type.

In the case where a reactive molecule having intrinsic birefringence is such as to be polymerized and/or crosslinked by irradiation with light, a photopolymerization initiator may be contained in a hologram recording material for promoting polymerization and/or crosslinking. In this case, if wavelength of light utilized for the recording of information is included in an absorption wavelength range of a photopolymerization initiator, the recording and fixation of information can be performed approximately simultaneously. Therefore, the constitution of a hologram recording device can be simplified.

In the following description, a hologram recording material containing at least a photoresponsive macromolecule and a nonreactive molecule (a molecule having no reactivity) having intrinsic birefringence as well as a hologram recording medium employing this is occasionally referred to as 'a first embodiment', and a hologram recording material containing at least a photoresponsive macromolecule and a reactive molecule having intrinsic birefringence as well as a hologram recording medium employing this is occasionally referred to as 'a second embodiment'.

In a second embodiment, the content of a photopolymerization initiator contained in a recording layer (that is, a recording material) is not particularly limited. However, in the case where a recording layer contains a photopolymerization initiator for promoting polymerization and/or crosslinking of a reactive molecule having intrinsic birefringence by light irradiated in recording information in a recording layer, it is particularly preferable that the content of a photopolymerization initiator in a hologram recording medium is in a range of less than approximately 0.1% by weight and the content of a reactive molecule having intrinsic birefringence therein is in a range of from approximately 30% by weight to approximately 80% by weight (a hologram recording material in which sensitive wavelength of the above-mentioned photopolymerization initiator and the content of the photopolymerization initiator and the reactive molecule having intrinsic birefringence are specified as well as a hologram recording medium employing this is occasionally referred to as 'a third embodiment' hereinafter).

In this case, the recording material/recording medium in a third embodiment can be subjected to accurate and high-sensitivity multiple recording with the utilization of polarization of light, and can be utilized as a recording material/recording medium of a write-once type excellent in fixity of information once recorded.

In the case where multiple recording is performed by using a hologram recording material containing a photoresponsive macromolecule, a reactive molecule having intrinsic birefringence, and a photopolymerization initiator whose absorption wavelength is the same as a wavelength range of light utilized for the recording of information, another polarized light is irradiated in each recording of new information, which is then fixed. Accordingly, the amount of a reactive molecule having intrinsic birefringence in an unpolymerized state contained in a recording layer is decreased in each recording. Thus, an unreacted reactive molecule having intrinsic birefringence orientable in accordance with orientation of a photoresponsive macromolecule is decreased in each repetition of the recording of information. In this case, as a recording medium disclosed in Japanese Patent Publication No. 3451319, the function of amplifying sensitivity by a liquid crystal molecule is deteriorated.

However, with regard to a recording medium of a third embodiment, the amount of a photoresponsive macromolecule contributable to next recording contained in a recording layer is always kept constant even though information is subjected to multiple recording. Accordingly, sensitivity on a certain level or higher corresponding to the amount of a photoresponsive macromolecule existing in a recording layer can always be maintained.

Thus, a recording medium of a third embodiment allows fixation of information. In addition thereto, a recording medium of a third embodiment easily maintains high sensitivity even in the case where information is subjected to multiple recording, as compared with a recording medium using a conventional photopolymer.

As described above, during multiple recording in a third embodiment, a reactive molecule having intrinsic birefringence serves mainly for the function of fixing information once recorded, and a photoresponsive macromolecule serves not merely for the function of inducing orientation of a reactive molecule having intrinsic birefringence but also for the function of securing sensitivity. Thus, in a third embodiment, high-sensitivity multiple recording with the utilization of polarization of light can be performed and information once recorded can be fixed.

In a third embodiment, as described above, a reactive molecule having intrinsic birefringence is such as to be polymerized or crosslinked by light irradiated in recording information in a recording layer. Thus, a hologram recording medium of a third embodiment is used, so that the recording and fixation of information can be performed approximately simultaneously, and the constitution of a hologram recording device, which performs recording and reproduction of information, can be simplified.

In a third embodiment, a photopolymerization initiator is contained in a recording layer in order to promote polymerization and/or crosslinking of a reactive molecule having intrinsic birefringence to be used for the recording layer by irradiation with light.

The content of a photopolymerization initiator contained in a recording layer (that is, a recording material) is preferably less than approximately 0.1% by weight, more preferably approximately 0.08% by weight or less. When the content of a photopolymerization initiator is approximately 0.1% by weight or more, polymerization and/or crosslinking of a reactive molecule having intrinsic birefringence are easily caused before a photoresponsive macromolecule finishes being sufficiently oriented, as described later. Thus, occasionally accurate recording can not be performed. In the case where the content of a photopolymerization initiator is low, fixity of information occasionally becomes insufficient. Therefore, the content of a photopolymerization initiator is preferably approximately 0.001% by weight or more of the reactive molecule.

Typically, in order to promptly record and fix information, it is more preferable that the amount of a photopolymerization initiator is larger. From this viewpoint, it is conceived that several percentages by weight of a photopolymerization initiator is preferably contained in a recording layer.

However, the recording and fixation of information in a third embodiment are performed in such a manner that irradiation with light causes the process (1), subsequently the process (2) and lastly the process (3). Actually, it is conceived that the reaction of these three stages is caused not sequentially with a clear pause from the above-mentioned process (1) to the process (2) and from the process (2) to the process (3), but with the competition of the process (3) in some degree at the stages of the processes (1) and (2). Accordingly, when the competition of the process (3) with the processes (1) and (2) becomes remarkable; that is, reaction rate of the process (3) is high relatively to reaction rate of the processes (1) and (2), polymerization and/or crosslinking of a reactive molecule having intrinsic birefringence (the fixation of information) are caused before a reactive molecule having intrinsic birefringence finishes being sufficiently oriented (before the recording of information is completed).

In particular, a photoresponsive macromolecule is so large in molecular size as to tend to be more inferior in molecular mobility. Thus, it is conceived that reaction rate of the process (1) becomes relatively lower and also reaction rate of the process (2) becomes relatively lower in accordance therewith, so that the above-mentioned problem becomes more remarkable.

With notice of this point, the inventors of the invention have conceived that it is important to weaken the competition of the process (3) with the processes (1) and (2); that is, to control reaction rate of the process (3) lower relatively to reaction rate of the processes (1) and (2). In this case, it is conceived that polymerization and/or crosslinking of a reactive molecule having intrinsic birefringence can be performed in such a state that a reactive molecule having intrinsic birefringence finishes being sufficiently oriented, so that high-sensitivity record can be realized. Here, an important factor in controlling reaction rate of the process (3) is conceived to be the content of a photopolymerization initiator. The inventors of the invention have found out on the basis of the knowledge described above that the content of a photopolymerization initiator less than approximately 0.1% by weight as described above allows higher-sensitivity record to be realized.

The content of a reactive molecule having intrinsic birefringence contained in a recording layer (that is, a recording material) is preferably in a range of from approximately 30% by weight to approximately 80% by weight, more preferably in a range of from approximately 35% by weight to approximately 65% by weight.

When the content of a reactive molecule having intrinsic birefringence is less than approximately 30% by weight, occasionally recording density is decreased and high sensitivity can't be obtained during multiple recording. When the content of a reactive molecule having intrinsic birefringence is more than approximately 80% by weight, the content of a photoresponsive macromolecule becomes so insufficient that sensitivity is occasionally deteriorated.

—Composition of a Hologram Recording Medium—

Next, the composition of a recording medium of the invention and materials to be used therefor are described in further detail.

A recording medium of the invention has at least a recording layer made of a recording material containing at least the above-mentioned photoresponsive macromolecule and molecule having intrinsic birefringence. Here, this recording layer is preferably provided on a substrate (or a base substance). A reflecting layer can be provided between the recording layer and the substrate. A protecting layer for protecting the recording layer can be provided on one face of the recording layer of which the substrate is provided on the other face. The protecting layer prefers to be a substrate (in this case, a hologram recording medium has a composition in which the recording layer is held between a pair of substrates). In addition, an inner layer can be provided as required for the purpose of securing adhesive property between the substrate and the reflecting layer, adhesive property between the substrate and the recording layer, or adhesive property between each of the reflecting layer, the recording layer and the protecting layer. An antireflection coat can further be provided on a necessary place such as the surface of the protecting layer.

The shape of a hologram recording medium is not particularly limited; if a recording layer is two-dimensionally formed with a certain thickness, optional shapes can be selected such as disk, sheet, tape and drum.

However, the shape of a hologram recording medium is preferably a discoid such that a hole is provided in the central portion thereof, which is utilized for a conventional optical recording medium, in view of being capable of easily utilizing manufacturing techniques and record reproduction systems of an existing optical recording medium.

(A Recording Layer)

A recording layer is made of a hologram recording material containing a photoresponsive macromolecule and a molecule having intrinsic birefringence necessarily and other components as required. Materials not directly related to recording and reproduction of information, such as a binder, may be used as other components.

The film thickness of a recording layer is preferably in a range of from approximately 3 μm to approximately 2 mm practically. A recording material composing a recording layer has less absorption of light in a green wavelength range than a conventional photoresponsive macromolecule by reason of using a photoresponsive macromolecule represented by formula (1). Thus, with regard to a recording medium of the invention, the film thickness of a recording layer can be thickened more as compared with a recording medium using a conventional photoresponsive macromolecule. Therefore, a further improvement in recording density by an increase in the film thickness of a recording layer can be intended in a recording medium of the invention.

From this viewpoint, in particular, in the case of assuming the utilization of a light source having the most typical wavelength and intensity practically, the film thickness is preferably in a range of from approximately 10 μm to approximately 2 mm, more preferably in a range of from approximately 200 μm to approximately 1.5 mm, when a recording medium is a volume hologram. A film thickness of less than approximately 10 μm occasionally does not allow higher recording density. A film thickness of more than approximately 2 mm occasionally causes the absorption of light by a recording layer to become remarkable and utilization efficiency of light to be deteriorated.

'A light source having the most typical wavelength and intensity practically' signifies a light source such that irradiation intensity of light on the recording layer surface of a hologram recording medium is in a range of from approximately 0.01 W/cm$^2$ to approximately 2 W/cm$^2$ by using an Ar laser or a YAG laser.

Each component contained in a recording layer is hereinafter described in further detail.

—A Photoresponsive Macromolecule—

A photoresponsive macromolecule, as is represented by formula (1), has at least a photoisomerization group (a side chain) which exhibits isomerization reaction (cis-trans isomerism resulting from an azobenzene skeleton) by irradiating with light, and a main chain represented by A.

Here, in formula (1), n is an integer in a range of 1 or more, preferably in a range of from approximately 4 to approximately 1000. The weight-average molecular weight of a photoresponsive macromolecule is not particularly limited but yet preferably in a range of from approximately 10000 to approximately 1000000.

A bivalent linking group $L_1$ composing a photoisomerization group signifies a group with a carbon atom number in a range of from 0 to approximately 100, preferably a group with a carbon atom number in a range of from approximately 1 to approximately 20. In the case where the carbon atom number is 0, the bivalent linking group $L_1$ signifies a mere bond, and that A and a benzene ring composing an azobenzene group are directly bonded.

Examples of the linking group $L_1$ with a carbon atom number of 1 or more include alkylene groups (preferably with a carbon atom number (occasionally referred to as 'C number' hereinafter) in a range of from approximately 1 to approximately 20, for example, including optionally substituted methylene, ethylene, propylene, butylene, pentylene, hexylene, octylene, decylene, undecylene and —CH$_2$PhCH$_2$— (p)), alkenylene groups (preferably with C number in a range of from approximately 2 to approximately 20, for example, including ethenylene, propenylene and butadienylene), alkynylene groups (preferably with C number in a range of from approximately 2 to approximately 20, for example, including ethynylene, propynylene and butadiynylene), cycloalkylene groups (preferably with C number in a range of from approximately 3 to approximately 20, for example, including 1,3-cyclopentylene and 1,4-cyclohexylene), arylene groups (preferably with C number in a range of from approximately 6 to approximately 26, for example, including optionally substituted 1,2-phenylene, 1,3-phenylene, 1,4-phenylene, 1,4-naphthylene and 2,6-naphthylene), heterylene groups (preferably with C number in a range of from approximately 1 to approximately 20, for example, including bivalent groups obtained by drawing out two hydrogen atoms from optionally substituted pyridine, pyrimidine, triazine, piperazine, pyrrolidine, piperidine, pyrrole, imidazole, triazole, thiophene, furan, thiazole, oxazole, thiadiazole and oxadiazole), amide groups, ester groups, sulfoamide groups, sulfonate groups, ureide groups, sulfonyl groups, sulfinyl groups, thioether groups, ether groups, imino groups, and carbonyl groups.

Also, examples thereof include one or a combination of more than one of the groups listed in above.

On the other hand, the structure of a main chain portion represented by A in formula (1) is not particularly limited if a known polymeric main chain structure. With notice of polymerization structure, for example, the structure may be a polymer polymerized by using one kind of a monomer, or a block copolymer and a random copolymer in the case of being polymerized by using two kinds or more of monomers. With notice of main chain molecular structure, for example, the structure may be polyether, polyester or polyurethane.

Basically, the main chain portion preferably has a molecular structure with high flexibility, specifically, preferably having a molecular structure offering an amorphous state such that a peak resulting from the melting point is not observed in subjecting a photoresponsive macromolecule to differential thermal analysis.

A side chain (a nonphotoisomerization group which exhibits no isomerization reaction by irradiating with light) in addition to a photoisomerization group may be bonded to the main chain. Here, this nonphotoisomerization group may be a group containing a known low-molecular liquid crystal structure such as biphenyl and terphenyl (occasionally referred to as 'a liquid crystal structure-containing group' hereinafter). Here, the liquid crystal structure-containing group contains at least a bivalent linking group directly bonding to the main chain and a liquid crystal structure portion bonding to this bivalent linking group.

In the case where the nonphotoisomerization group is the liquid crystal structure-containing group, the nonphotoisomerization group and the liquid crystal structure-containing group can be made to interact by adjusting bendability and length of a linking group $L_1$ composing a photoisomerization group and a linking group composing the liquid crystal structure-containing group, and adjusting the main chain length between a bonding site where a photoisomerization group is bonded to the main chain and a bonding site where the liquid crystal structure-containing group is bonded to the main chain. In this case, when the nonphotoisomerization group is oriented, the liquid crystal structure-containing group can also be oriented in linkage with the orientation of the nonphotoisomerization group (one example of two-stage orientation by the interaction between these two kinds of side chains bonded to the main chain is described in JP-A No. 2005-274628).

In this case, orientation of a molecule having intrinsic birefringence can be caused by direct interaction between a molecule having intrinsic birefringence and a photoisomerization group as well as interaction between the liquid crystal structure-containing group oriented by interaction with a photoisomerization group and a molecule having intrinsic birefringence.

In order that a molecule having intrinsic birefringence can be oriented in accordance with the orientation of the liquid crystal structure-containing group, the molecular structure of the liquid crystal structure-containing group and the molecular structure of a molecule having intrinsic birefringence are preferably similar in some degree, the molecular structure of the liquid crystal structure-containing group and the molecular structure of a molecule having intrinsic birefringence are particularly preferably similar, and the molecular structure of the liquid crystal structure-containing group and the molecular structure of a molecule having intrinsic birefringence are most preferably the same. In this case, the interaction between the liquid crystal structure-containing group and a molecule having intrinsic birefringence becomes more favorable, so that compatibility between a photoresponsive macromolecule and a molecule having intrinsic birefringence can also be improved more.

It is assumed from the above description that the above-mentioned effect of improving the interaction between the liquid crystal structure-containing group and a molecule having intrinsic birefringence and the above-mentioned effect of improving the compatibility between a photoresponsive macromolecule and a molecule having intrinsic birefringence are similarly obtained even though a photoisomerization group has a different structure from the structure represented by formula (1).

Here, 'the molecular structures are similar' signifies that the molecular structure of the liquid crystal structure portion (signifying a basic skeleton portion except a substituent in the paragraph) composing a molecule having intrinsic birefringence and the molecular structure of the liquid crystal structure portion of the liquid crystal structure-containing group are at least the same in the case where a molecule having intrinsic birefringence contains a liquid crystal structure. 'The molecular structures are the same' signifies that kind and bonding site of a substituent (yet excluding a reactive group in the case where a molecule having intrinsic birefringence is a reactive molecule, a linking group provided for bonding this reactive group to the liquid crystal structure portion, and a linking group composing the liquid crystal structure-containing group) bonded to the liquid crystal structure portion are also the same between a molecule having intrinsic birefringence and the liquid crystal structure-containing group in the case where a molecule having intrinsic birefringence contains a liquid crystal structure.

In addition, 'the molecular structures are similar in some degree' signifies that the principal part of the molecular structure of the liquid crystal structure portion (signifying a basic skeleton portion except a substituent in the paragraph) composing a molecule having intrinsic birefringence and the principal part of the molecular structure of the liquid crystal structure portion of the liquid crystal structure-containing group are at least the same in the case where a molecule having intrinsic birefringence contains a liquid crystal structure.

A photoresponsive macromolecule represented by formula (1) has a structure represented by the following formula (2) more preferably also in consideration of the viewpoint described in the above.

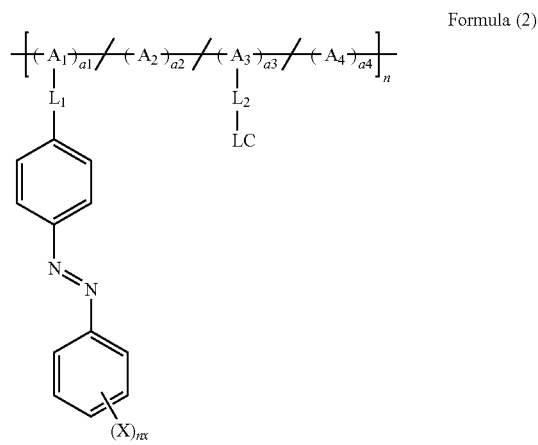

Formula (2)

Here, in formula (2), $L_1$, X, n and nx are the same as are shown in formula (1). a1, a2, a3 and a4 signify molar ratios satisfying a relation of a1+a2+a3+a4=1. a1 is in a range of from more than 0 to 1, and a2, a3 and a4 are in a range of from 0 to less than 1.

$L_2$ represents the same bivalent linking group as $L_1$ shown in formula (1). LC represents a substituted or unsubstituted monovalent group having a liquid crystal structure, and examples of the liquid crystal structure include a known liquid crystal molecular structure such as the following structural formulae LC1 to LC10.

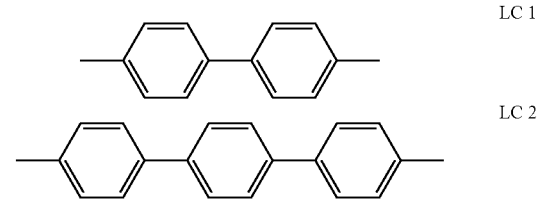

LC 1

LC 2

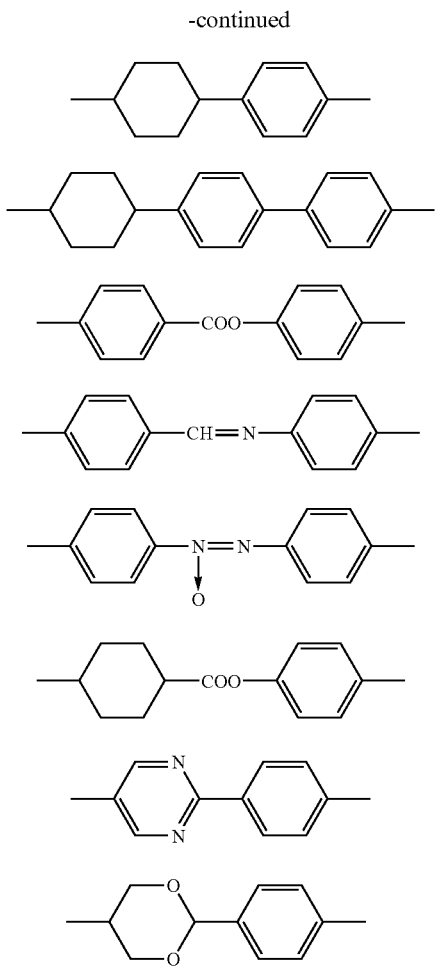

The structural formulae LC1 to LC10 are represented as bivalent groups having two bonding hands, among which one bonding hand is bonded to the linking group $L_2$ and the other bonding hand is bonded to a substituent. The substituent is selected from hydrogen atom, cyano group, nitro group and fluorocarbon group, among which cyano group is preferable.

$A_1$ and $A_3$ represent trivalent groups represented by the following formula (3).

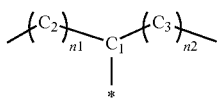

Formula (3)

In formula (3), a bonding hand represented by '*' signifies a bonding hand bonded to the linking groups $L_1$ and $L_2$ (and so forth), and n1 and n2 represent integers of 0 or more and approximately 2 or less.

$C_1$ represents a trivalent group selected from the following structural formula group 1, and $C_2$ and $C_3$ represent bivalent groups selected from the following structural formula group 2.

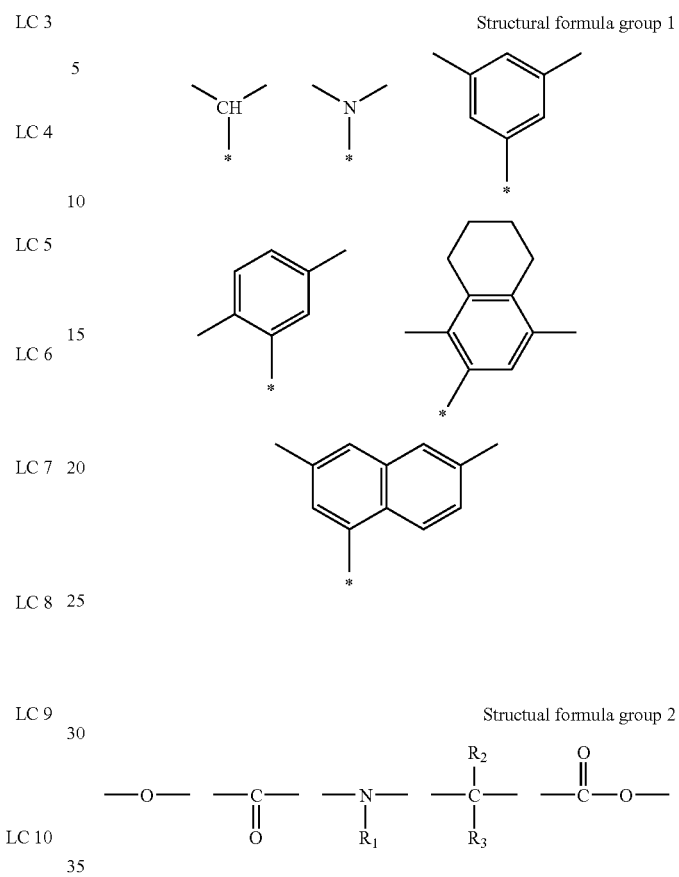

In the structural formula group 2, a group except a substituted or unsubstituted alkylene group is not selected as a group denoting $C_2$ and $C_3$ when n1 and n2 are 2. Also, in the structural formula group 2, $R_1$ represents a hydrogen atom, or a group selected from alkyl group with a carbon number in a range of from approximately 1 to approximately 20, alkenyl group with a carbon number in a range of from approximately 1 to approximately 20, cycloalkyl group with a carbon number in a range of from approximately 1 to approximately 20, aryl group with a carbon number in a range of from approximately 1 to approximately 20 and heterocyclic group with a carbon number in a range of from approximately 2 to approximately 20. $R_2$ and $R_3$ represent a hydrogen atom, or a group selected from cyano group, alkyl group with a carbon number in a range of from approximately 1 to approximately 20 and aryl group with a carbon number in a range of from approximately 1 to approximately 20, among which a hydrogen atom or methyl group are preferable and a hydrogen atom is particularly preferable.

$A_2$ and $A_4$ represent bivalent groups selected from the following formula (4) or formula (5).

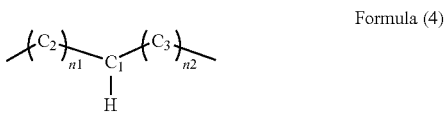

Formula (4)

-continued

Formula (5)

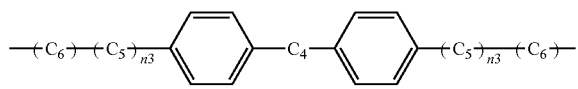

Here, formula (4) has a structure such that a hydrogen atom is bonded to a bonding hand represented by '*' in formula (3), and $C_1, C_2, C_3$, n1 and n2 are the same as are shown in formula (3).

In formula (5), n3 represents an integer of 0 or 1, $C_4$ represents a bivalent group selected from the following structural formula group 3, $C_5$ represents a bivalent group represented by the following structural formula 4, and $C_6$ represents a bivalent group selected from the following structural formula group 6.

Structural formula group 3

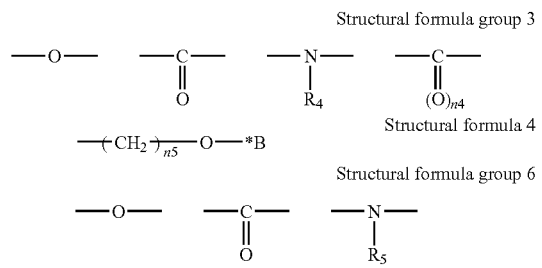

Structural formula 4

Structural formula group 6

Here, in the structural formula group 3, $R_4$ represents methyl group or phenyl group, and n4 represents an integer in a range of from 0 to approximately 2. In the structural formula 4, n5 represents an integer in a range of from approximately 2 to approximately 12, and a bonding hand represented by '*B' signifies a bonding hand bonded to a benzene ring in formula (5). In addition, in the structural formula group 6, $R_5$ represents a hydrogen atom, or a group selected from alkyl group with a carbon number in a range of from approximately 1 to approximately 20, alkenyl group with a carbon number in a range of from approximately 1 to approximately 20, cycloalkyl group with a carbon number in a range of from approximately 1 to approximately 20, aryl group with a carbon number in a range of from approximately 1 to approximately 20 and heterocyclic group with a carbon number in a range of from approximately 2 to approximately 20.

A possible molecular structure of a photoresponsive macromolecule represented by formula (2) is described above, and a structure such that a3 and a4 in formula (2) are 0 can be selected in the case where a photoresponsive macromolecule has no liquid crystal structure-containing group. In this case, $A_1$ and $A_2$ composing the main chain preferably have a molecular structure with high flexibility. Specific examples of a main chain structure having the molecular structure with high flexibility include such that a structure represented by $C_4$ is —S(=O)$_2$— and n3 is 1 in the case where $A_2$ composing the main chain has a structure represented by formula (5).

One example of more specific molecular structures in the case where a photoresponsive macromolecule has no liquid crystal structure-containing group is represented by the following structural formula 7.

Structural formula 7

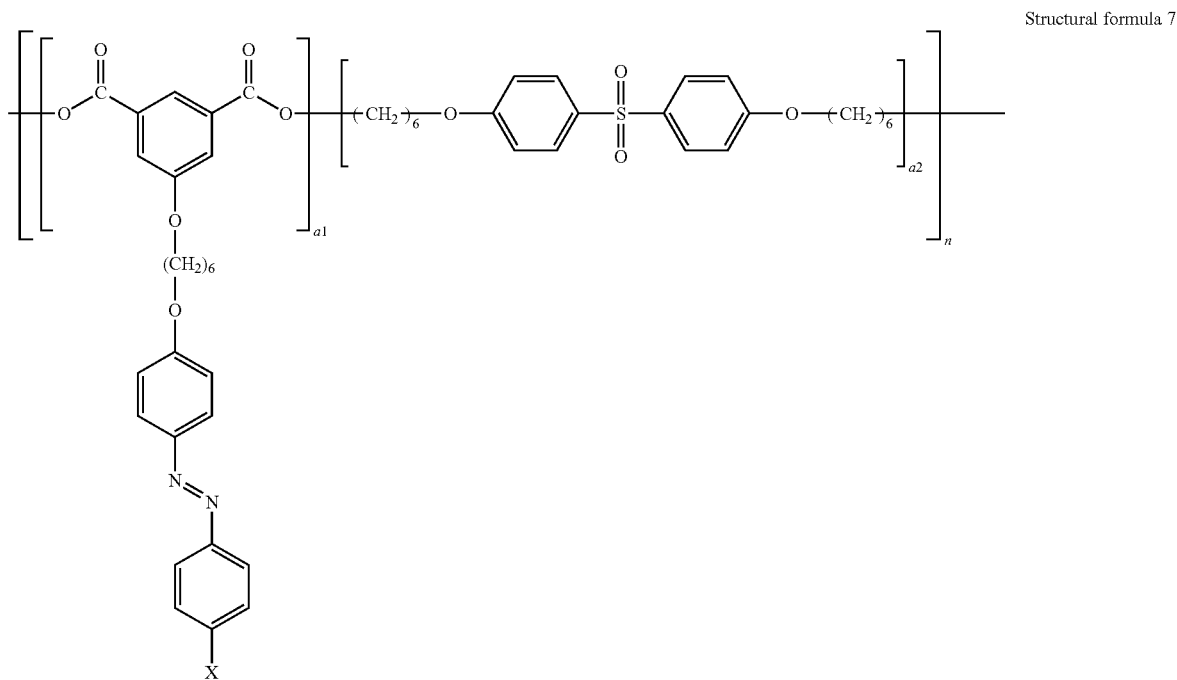

Here, in the structural formula 7, X, n, a1 and a2 are the same as are shown in formula (1) and formula (2).

On the other hand, a structure such that a3 and a4 in formula (2) are in a range of from more than 0 to less than 1 can be selected in the case where a photoresponsive macromolecule has a liquid crystal structure-containing group. a1/(a1+a3) is preferably in a range of from approximately 0.0001 to approximately 0.8, more preferably in a range of from approximately 0.01 to approximately 0.6.

In order to improve the interaction between a photoisomerization group and a liquid crystal structure-containing group disposed on the main chain adjacently to each other, the main chain preferably has a molecular structure with high rigidity; on the contrary, a photoresponsive macromolecule as a whole preferably has flexibility.

From this viewpoint, in formula (2), it is preferable that one of $A_2$ and $A_4$ composing the main chain has a molecular structure with high flexibility and the other thereof has a molecular structure with high rigidity. Examples of a main chain structure having the molecular structure with high flexibility include the above-mentioned example in the case where $A_2$ and $A_4$ composing the main chain have a structure represented by formula (5). On the contrary, in a structure represented by formula (5), examples of a main chain structure having the molecular structure with high rigidity include such that a structure represented by $C_4$ is —O—.

One example of more specific molecular structures in the case where a photoresponsive macromolecule has no liquid crystal structure-containing group is represented by the following structural formula 8.

—A Molecule Having Intrinsic Birefringence—

A known substance having intrinsic birefringence can be utilized as a molecule having intrinsic birefringence, which is yet preferably a molecule such that refractive index in the long axis direction (Ne) and refractive index in the short axis direction (No) intrinsic to a molecule differ. Here, intrinsic birefringence represents birefringence intrinsic to a molecule and is a value which can be calculated from birefringence of bulk in solid or liquid crystal state as well as molecular orbital calculation. Refractive index modulation is utilized for the recording of information in a hologram recording medium utilizing a hologram recording material of the invention. Thus, higher refractive index anisotropy $\Delta n=|Ne-No|$ of a molecule having intrinsic birefringence is more preferable; specifically, $\Delta n$ is preferably approximately 0.01 or more, more preferably approximately 0.05 or more and most preferably approximately 0.1 or more.

Accordingly, a molecule having intrinsic birefringence is preferably a rod-like molecule such that conjugation is connected long in the long axis direction of the molecule (for example, a liquid crystal molecule containing a molecular structure represented by the above-mentioned structural formulae LC1, LC2 and the like).

The after-mentioned liquid crystal molecule is preferably used as a molecule having intrinsic birefringence, which is not limited thereto but the so-called dichromatic compound (pigment) is also utilizable, for example. The liquid crystal molecule is hereinafter described in further detail.

This liquid crystal molecule has various skeletons which offer liquid crystal orientations such as nematic property, cholesteric property or smectic property. Examples of a cyclic Structural formula 8

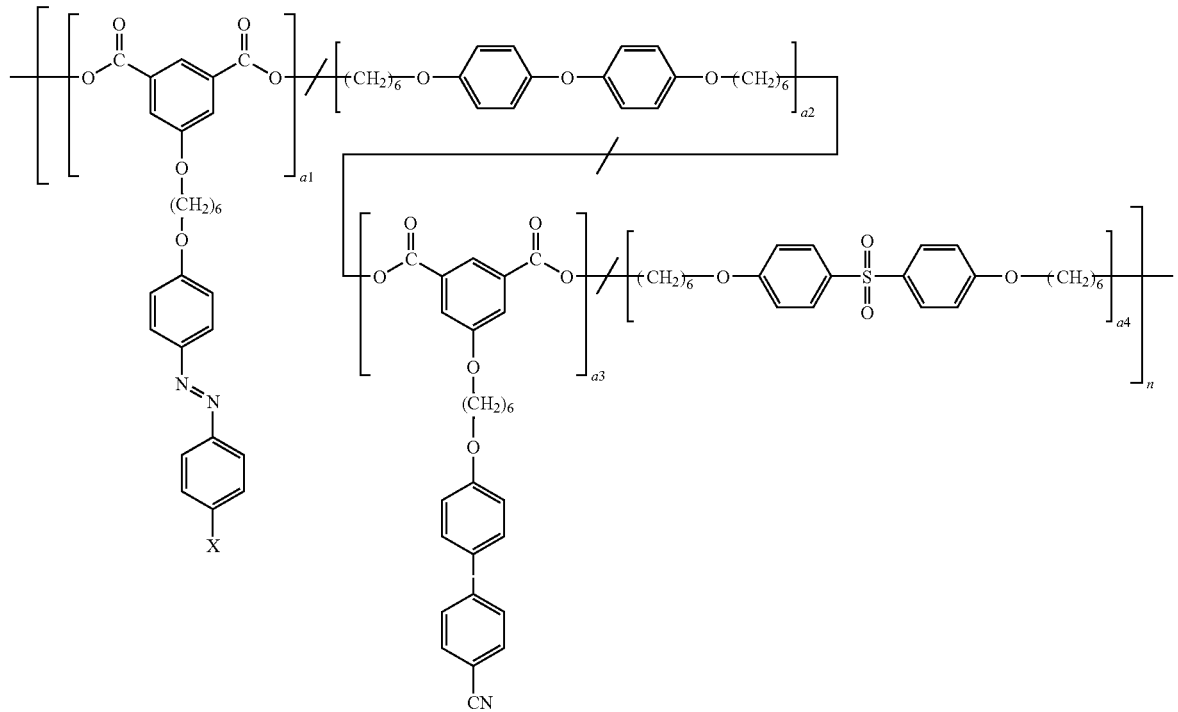

Here, in the structural formula 8, X, n, a1, a2, a3 and a4 are the same as are shown in formula (1) and formula (2).

unit as a mesogenic group, which offers liquid crystal orientations of the liquid crystal molecule, include biphenyl, phenyl benzoate, phenylcyclohexane, phenylpyrimidine, diphenylacetylene, diphenyl benzoate, bicyclohexane, cyclohexylbenzene and terphenyl. The end of these cyclic units may have substituents such as cyano group, alkyl group, alkoxy group and halogen group.

In the case where a molecule having intrinsic birefringence is a reactive molecule having intrinsic birefringence, a reactive liquid crystal molecule having unsaturated double bond such as acryloyl group, methacryloyl group and vinyl group, and a polymerizable and/or crosslinkable reactive group such as epoxy group is appropriately used for the above-mentioned liquid crystal molecule. In order to fix more firmly the oriented state after a reactive molecule having intrinsic birefringence is oriented, a reactive liquid crystal molecule preferably has two or more reactive groups. In addition, a reactive group may indirectly be bonded to the liquid crystal molecule through a bivalent linking group. Here, for example, the same as bivalent linking groups $L_1$ and $L_2$ shown in formula (1) and formula (2) can be selected as the bivalent linking group.

The liquid crystal molecule to be used for a recording material can be used singly or in a combination of two kinds or more. A reactive liquid crystal molecule is ordinarily subjected to orientation treatment and thereafter made into a polymer by crosslinking and/or polymerization treatment in a method using of heat or light.

—A Photopolymerization Initiator—

In a second embodiment and a third embodiment, a photopolymerization initiator is used for promoting polymerization and/or crosslinking of a reactive molecule having intrinsic birefringence contained in a recording layer made of a recording material.

Examples of a usable photopolymerization initiator include ordinary photopolymerization initiators such as acetophenone, for example, 2,2-diethoxyacetophenone, benzoin, benzophenone, thioxanthone, diazonium, sulfonium salt, iodonium salt and selenium salt. A photopolymerization initiator is preferably such as to be dissolved in or compatible with a reactive molecule having intrinsic birefringence and a photoresponsive macromolecule for restraining the influence of light scattering. It is also preferable for a photoresponsive macromolecule to be transparent. Examples of a photopolymerization initiator include Irgacure784, Irgacure184, Irgacure651 and Irgacure369 manufactured by Chiba Specialty Chemicals.

A sensitizer can also be added to a recording material in addition to a photopolymerization initiator within the purpose of the invention. Generally, the added amount of this photopolymerization initiator is preferably in a range of from approximately 0.001% by weight to approximately 10% by weight of the reactive molecule, more preferably in a range of from approximately 0.1% by weight to approximately 5% by weight of the reactive molecule.

—Other Components (Binder and the Like)—

Other components such as binder resin may be contained as required in a recording material composing a recording layer.

For example, polymethacrylate (PMMA) and polyvinyl alcohol (PVA) excellent in optical property are utilizable as this binder resin. A polyester material having cyanobiphenyl as a side chain, which is represented by the following structural formula 9, is also appropriate as the binder resin.

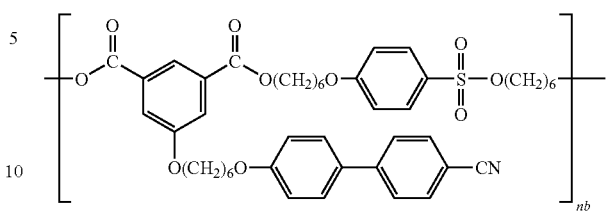

Structural formula 9

In the structural formula 9, nb represents an integer of 1 or more. This polyester material has penetrability in a wavelength range of general light utilized for recording/reproducing information in a hologram recording medium. In the case of being used together with a photoresponsive macromolecule having a photoisomerization group, this polyester material is effective in achieving higher sensitivity of a photoresponsive macromolecule by reason of being capable of inducing birefringence while following isomerization of a photoisomerization group. 'A polyester material is used together with a photoresponsive macromolecule having a photoisomerization group' includes not merely physical mixing of a photoresponsive macromolecule having a photoisomerization group and a polyester material represented by the structural formula 9, but also chemical mixing, namely, the case where a repeating unit represented by the structural formula 9 is contained in a (polymeric) photoresponsive macromolecule having a photoisomerization group (a copolymer is formed).

—Formation of a Recording Layer—

Known methods can be utilized for the formation of a recording layer in accordance with a recording material of the invention used as a recording layer material, examples thereof including liquid-phase film formation such as spray method, spin coat method, dip method, roll coat method, blade coat method, doctor roll method and screen printing method, which use application liquid with a recording material of the invention dissolved, and vapor deposition method. In addition, a tabular recording layer (thick film) can also be formed by utilizing injection molding or hot pressing.

(A Substrate/a Base Substance)

Various materials can optionally be selected for use as a substrate and a base substance if they have a smooth surface. Examples thereof include metal, ceramics, resin and paper. Also, the shape of a substrate and a base substance is not particularly limited. A discoidal flat substrate such that a hole is provided in the central portion thereof, which is utilized for a conventional optical recording medium, is preferably used in view of being capable of easily utilizing manufacturing techniques and record reproduction systems of an existing optical recording medium.

Specific examples of substrate materials include glass; acrylic resins such as polycarbonate and polymethyl methacrylate; vinyl chloride resins such as polyvinyl chloride and vinyl chloride copolymer; epoxy resin; amorphous polyolefin; polyester; and metal such as aluminum; these may be used together as required.

Among the above-mentioned materials, amorphous polyolefin and polycarbonate are preferable, and polycarbonate is particularly preferable in view of humidity resistance, dimensional stability and inexpensive costs.

A guide channel for tracking or irregularities (prigrooves) representing information such as address signal may be formed on the substrate surface.

Materials through which a wavelength range of used light (recording light and reproducing light) penetrates are used in the case where a recording layer is irradiated with light through a substrate in recording and reproducing. In this case, permeability in a wavelength range of used light (a wavelength range in which intensity becomes local maximum in the case of laser light) is preferably approximately 90% or more.

In the case of providing a reflecting layer on the substrate surface, an under coat layer is preferably formed on the substrate surface for the purpose of improving flatness and adhesive force.

Examples of materials for an under coat layer include polymeric substances such as polymethyl methacrylate, acrylic acid-methacrylic acid copolymer, styrene-maleic anhydride copolymer, polyvinyl alcohol, N-methylolacrylamide, styrene-vinyltoluene copolymer, chlorsulfonated polyethylene, nitrocellulose, polyvinyl chloride, chlorinated polyolefin, polyester, polyimide, vinyl acetate-vinyl chloride copolymer, ethylene-vinyl acetate copolymer, polyethylene, polypropylene and polycarbonate; and surface modifier such as silane coupling agent.

An under coat layer can be formed by coating the substrate surface with application liquid prepared by dissolving or dispersing the above-mentioned materials in proper solvent through application methods such as spin coat, dip coat and extrusion coat. Generally, the layer thickness of an under coat layer is preferably in a range of from approximately 0.005 μm to approximately 20 μm, more preferably in a range of from approximately 0.01 μm to approximately 10 μm.

(A Reflecting Layer)

A reflecting layer is preferably composed of a light-reflective material such that a reflectance against laser light is approximately 70% or more. Examples of this light-reflective material include metals and semimetals such as Mg, Se, Y, Ti, Zr, Hf, V, Nb, Ta, Cr, Mo, W, Mn, Re, Fe, Co, Ni, Ru, Rh, Pd, Ir, Pt, Cu, Ag, Au, Zn, Cd, Al, Ga, In, Si, Ge, Te, Pb, Po, Sn and Bi, or stainless steel.

These light-reflective materials may be used singly, in a combination of two kinds or more, or as alloy. Cr, Ni, Pt, Cu, Ag, Au, Al and stainless steel are preferable among these. In particular, Au, Ag, Al or alloy thereof are preferable, and Au, Ag or alloy thereof are more preferable.

A reflecting layer can be formed on the substrate by subjecting the above-mentioned light-reflective materials to vapor deposition, sputtering or ion plating. Generally, the layer thickness of a reflecting layer is preferably in a range of from approximately 10 nm to approximately 300 nm, more preferably in a range of from approximately 50 nm to approximately 200 nm.

(A Protecting Layer)

A known material can be used as a protecting layer if made of a material and thickness capable of protecting a recording layer mechanically, physically and chemically under an ordinary use environment thereof. General examples thereof include transparent resin and transparent inorganic materials such as $SiO_2$.

Materials through which a wavelength range of used light penetrates are used in the case where a recording layer is irradiated with light through a protecting layer in recording and reproducing. In this case, permeability in a wavelength range of used light (a wavelength range in which intensity becomes local maximum in the case of laser light) is preferably approximately 90% or more. This is the same also with regard to an inner layer provided on a face, on which light of a recording layer enters, for the purpose of improving adhesive property.

A resin film made of polycarbonate or cellulose triacetate previously formed into a sheet can be used in the case where a protecting layer is composed of resin. Then, a protecting layer is formed by sticking this resin film on a recording layer. In sticking together, in order to secure adhesive strength, it is preferable to stick together through adhesives of heat-hardening or UV curable types, and thereafter cure the adhesives by heat treatment or UV irradiation. The thickness of the resin film used as a protecting layer is not particularly limited if capable of protecting a recording layer, yet practically preferably in a range of from approximately 30 μm to approximately 200 μm, more preferably in a range of from approximately 50 μm to approximately 150 μm.

Alternatively, a protecting layer can also be formed by forming thermoplastic resin, thermosetting resin and photocurable resin through application instead of this resin film. An antireflection coat may be provided on a protecting layer as required.

In the case where a protecting layer is composed of transparent ceramics or glass materials such as $SiO_2$, $MgF_2$, $SnO_2$ and $Si_3N_4$, a protecting layer can be formed by utilizing sputtering method or sol-gel method. The thickness of the transparent inorganic materials formed as a protecting layer is not particularly limited if capable of protecting a recording layer, yet practically preferably in a range of from approximately 0.1 μm to approximately 100 μm, more preferably in a range of from approximately 1 μm to approximately 20 μm.

(A Producing Method of a Recording Medium)

Next, a producing method of a hologram recording medium of the invention having the above-mentioned constitution is described.

In the case of being a plane hologram, a hologram recording medium of the invention can be produced by sequentially laminating and/or depositing a recording layer and the like on a substrate in accordance with a material used for each layer, as described above. The main flow of producing processes for a hologram recording medium composed so that a recording layer and a protecting layer are provided on a substrate is briefly described as an example.

First, a recording layer is formed and dried on a polycarbonate substrate so that a desirable film thickness is obtained through a spin coating method by using coating solution in which a photoresponsive macromolecule, a molecule having intrinsic birefringence and other components used as required are dissolved in solvent. Next, a hologram recording medium composed of protecting layer/recording layer/substrate can be obtained by sticking the recording layer and a cellulose triacetate resin film for forming a protecting layer together with a double-stick tape.

In the case where a hologram recording medium of a second embodiment and a third embodiment is a volume hologram and a reactive molecule having intrinsic birefringence is such as not to be thermally polymerized, and in the case where a hologram recording medium of a first embodiment is a volume hologram, a recording layer can be formed by injection molding or hot pressing. Such a recording medium can be produced specifically in the following manner.

First, in the case of utilizing injection molding, a hologram recording medium can be produced in the following manner, for example. First, a disk-shaped molded product as a recording layer is produced by injection molding. Next, this disk-shaped molded product is held between a pair of disk-shaped transparent substrates and stuck together by hot pressing for hot-melt adhesive.

In the injection molding process, resin as a raw material (resin containing at least a photoresponsive macromolecule and a molecule having intrinsic birefringence) is heated and melted, and the melted resin is injected into a molding die and molded into a disk. Either of an inline type injection molding machine such that the plasticating function and injection function of the raw material are integrated, and a preplunger type injection molding machine such that the plasticating function and injection function thereof are separated can be used as an injection molding machine. The conditions of injection molding are preferably such that injection pressure is in a range of from approximately 1000 kg/cm$^2$ to approximately 3000 kg/cm$^2$ and injection rate is in a range of from approximately 5 mm/sec to approximately 30 mm/sec.

In the hot pressing process, the thick-plate molded product obtained in the injection molding process is held between a pair of disk-shaped transparent substrates and hot-pressed under vacuum.

With regard to a hologram recording medium produced in this manner, a recording layer is not formed on a substrate into a film but formed separately and independently by injection molding, so that a recording layer is easily formed into a thick film, which is appropriate for mass production. A recording layer is stuck to the transparent substrates by hot pressing, so that residual strain of the molded product due to injection molding is uniformized. In addition thereto, even though a recording layer is formed into a thick film, recording characteristics are not deteriorated by the influence of light absorption and scattering.

On the other hand, in the case of utilizing hot pressing, a hologram recording medium can be produced in the following manner, for example. First, powdery resin (resin containing at least a photoresponsive macromolecule and a molecule having intrinsic birefringence) is held between substrates (pressing members) having high releasability such as Teflon (registered trademark) sheet, and hot-pressed under vacuum in this state to directly mold a recording layer.

In the hot pressing process, vacuum hot pressing is preferably performed. In this case, powdery resin is loaded as a sample between a pair of the pressing members. Next, in order to prevent air bubbles from occurring, the sample is gradually heated up to predetermined temperature under a reduced pressure of approximately 0.1 MPa, and pressurized through the pressing members. On this occasion, it is preferable that heating temperature is a temperature of the glass transition temperature (Tg) or more of the resin material and pressure of the pressurization is in a range of from approximately 0.01 ton/cm$^2$ to approximately 0.1 ton/cm$^2$. After hot pressing is performed for a predetermined time, heating and pressurizing are stopped and the sample is cooled to room temperature and thereafter taken out.

The resin material held between a pair of the pressing members is heated and melted by performing hot pressing on the conditions described above, and subsequently cooled to thereby obtain a tabular recording layer. An optical recording medium is obtained by lastly removing the pressing members. With regard to a photoresponsive macromolecule composing a recording layer, the glass transition temperature Tg thereof is typically in a range of from approximately 30° C. to approximately 70° C. Thus, hot pressing is performed by heating at a temperature higher by approximately 5° C. than the glass transition temperature Tg, so that a recording layer can easily be molded into desirable thickness. Residual strain is not caused in hot pressing.

A protecting layer may be provided as required for the purpose of improving scratch resistance and humidity resistance of a hologram recording medium made of this recording layer.

With regard to a hologram recording medium produced in this manner, a recording layer is not formed on a substrate into a film but formed separately and independently by hot pressing, so that a recording layer is easily formed into a thick film. A recording layer is molded by hot pressing, so that residual strain of the molded product is not caused and recording characteristics are not deteriorated by the influence of light absorption and scattering even though a recording layer is formed into a thick film. In the case where polymerization reaction is caused in a reactive molecule by heat, the medium is produced by injecting and molding with only pressure.

<A Hologram Recording Method>

Next, a hologram recording method employing a hologram recording medium of the invention is described. In a hologram recording method of the invention, a recording medium of the invention is irradiated with light, so that information can be recorded in a recording layer of the recording medium and the information once recorded can be reproduced.

In the case of utilizing a hologram recording medium of a third embodiment, the recording of information is particularly preferably multiple recording utilizing polarized light. In this case, high-sensitivity multiple recording as well as fixation of information once recorded can be realized. In addition thereto, polarized light is utilized, so that recorded data can be locked for security and also made to perform an operation.

Next, an optical recording reproducing device is described, which performs recording and/or reproduction of information by using the hologram recording medium of the invention described above. An optical recording reproducing device used for the invention can have a constitution to which known recording/reproduction methods such as hologram recording and light absorbance modulation recording are applied in accordance with the specifications of a hologram recording medium used for recording and reproduction. Among these, an optical recording reproducing device used for the invention preferably has a constitution to which hologram recording utilizing polarized light is applied.

In this case, an optical recording reproducing device used for the invention is preferably provided with at least a signal light source for irradiating a hologram recording medium with signal light in accordance with information on the occasion of recording information in a hologram recording medium, and a reference light source for irradiating a hologram recording medium with reference light on the occasion of reproducing (reading out) information recorded in a hologram recording medium. An optical recording reproducing device may be provided with a reading sensor (such as CCD) utilizing a photoelectric conversion element for reading information (reproduced light or diffracted light) reproduced by irradiation of a hologram recording medium with reference light.

In addition, an optical recording reproducing device may be a record only or read only device having a constitution in which a signal light source or a reference light source and a reading sensor is omitted as required.

Various optical systems utilized for an ordinary optical recording reproducing device are preferably applied as required to an optical recording reproducing device, for example, by forming an imaging optical system for irradiating a hologram recording medium with signal light by typically utilizing mirror, beam splitter and lens, and taking signal light and reference light out of the same light source by utilizing a beam splitter.

A light source of signal light and/or reference light is not particularly limited but typically a known laser light source such as He—Ne laser and Ar laser is preferably used. Even though not so completely monochromatic light as laser, a light source, such as an ultra-high-pressure mercury-vapor lamp, having such a small bright line spectrum that half-value width of the spectrum is approximately 2 nm to 3 nm can also be utilized, and white light sources such as sun and electric lamp may be used.

In addition, in the case where a used hologram recording medium is a so-called disk-shaped medium such as commercially available DVD and CD-ROM, an optical recording reproducing device is preferably provided with various mechanisms in accordance with a disk-shaped medium utilized for DVD and CD-ROM; a mechanism such as a motor for retaining and rotating a disk, and a mechanism for irradiating a predetermined position of a disk in the horizontal direction with signal light and reference light (in the case where a light source is of a fixed type, a galvanomirror is utilized and the light source is made into a so-called head capable of scanning in the horizontal direction of a disk).

Examples of a hologram recording mode include hologram recording such that plural holograms can be recorded in a single region by changing an angle between a normal line to a recording surface and incident object light, and hologram recording such that plural holograms can be recorded in superposed regions by changing a position of incident light on a recording surface.

One example of an optical recording reproducing device used for the invention is hereinafter described by using the Fig.

As shown in FIG. 1, a 532-nm emission line of a solid-state laser (Nd:YVO$_4$) 20 with laser diode excitation is used for recording and reproducing. Linearly polarized light emitted from the solid-state laser is rotated in polarization by a half-wave plate 21, and thereafter divided into two light waves of signal light 40 and reference light 42 by a polarizing beam splitter 22. Then, the balance in intensity between the two light waves can be adjusted by controlling the rotation angle of polarization. These two light waves cross in a recording medium 24 and thereby induce optical anisotropy in the recording medium 24 in accordance with intensity distribution or polarization distribution by interference of the two light waves. A half-wave plate 33 disposed on an optical path of signal light 40 controls polarization of signal light 40. The control of polarization of signal light 40 allows an intensity modulation hologram such that polarization directions of signal light 40 and reference light 42 are parallel or a polarization modulation hologram such that polarization directions of both are perpendicular to be recorded in the recording medium 24.

Diffracted light by recorded information is obtained by irradiating the recording medium 24 with only reference light 42 during reproducing to be capable of measuring optical output thereof by a power meter 25. Then, diffraction efficiency of the recording medium 24 can be obtained by calculating the ratio of diffracted light intensity to reference light intensity.

In an optical recording reproducing device used for the invention, a recording medium of the invention is disposed as the recording medium 24 and can be made to perform recording and reproducing of information. Then, an intensity modulation hologram such that polarization direction of signal light 40 and polarization direction of reference light 42 are parallel as well as a polarization modulation hologram such that polarization direction of signal light 40 and polarization direction of reference light 42 are perpendicular can be recorded by adjusting the half-wave plate 33 and the polarizing beam splitter 22.

EXAMPLES

The present invention is hereinafter described in further detail by referring to examples, but yet is not limited to only the following examples.

<Synthesis of a Photoresponsive Macromolecule>

(Synthesis of a Photoresponsive Macromolecule A1)

A photoresponsive macromolecule A1 such that X in the structural formula 7 is —CF$_3$, a1 is 0.5 (molar ratio), a2 is 0.5 (molar ratio) and the weight-average molecular weight is 22000 is synthesized as a photoresponsive macromolecule in the following manner.

0.2 mol of 4-hydroxy-4'-trifluoromethyl azobenzene, 2 mol of 1,6-dibromohexane, 1.45 mol of anhydrous potassium carbonate and 800 ml of acetone are put in a three-necked flask provided with a mechanical stirrer, and refluxed and reacted by using a water bath for 24 hours. The solution after being reacted stands to cool and thereafter is poured into pure water to filter out precipitate intended for refining, which is dried under reduced pressure. Thereafter, the precipitate dried under reduced pressure is recrystallized and refined by acetone to obtain solid content. The solid content is a substance corresponding to a monomer composing a side chain portion of a photoresponsive macromolecule A1 (hereinafter referred to as 'a side chain monomer').

250 ml of dimethylformamide is added to 0.3 mol of 4,4'-sulfonyldiphenol, 0.66 mol of 6-chloro-1-hexanol and 0.7 mol of anhydrous potassium carbonate, and stirred to obtain suspended solution. This solution is heated to a temperature of 160° C. by using an oil bath, and reacted for 24 hours. Thereafter, a white powdery substance produced in mixed liquid, in which the solution after being reacted is added to water containing a small amount of hydrochloric acid, is separated by filtration and thereafter dried. The dried white powdery substance is recrystallized in water-N,N-dimethylformamide solution to thereby obtain refined solid content (bis(4-hydroxyhexyloxyphenyl)sulfone). The solid content is a substance corresponding to a monomer composing a main chain portion of a photoresponsive macromolecule A1 (hereinafter referred to as 'a main chain monomer').

0.005 mol of the side chain monomer, 0.005 mol of the main chain monomer and 0.05 g of zinc acetate are put in a round-bottom flask disposed in an oil bath, and reacted under nitrogen atmosphere for 2 hours while maintaining the temperature at 150 to 155° C. Thereafter, the inside of the flask is decompressed up to $10^{-11}$ Torr and stirred for 20 minutes. Thereafter, the inside of the flask is heated up to a temperature of 170 to 175° C. over 30 minutes and simultaneously decompressed up to 2 to 3 Torr. This state is maintained for 2 hours to perform reaction. Next, the obtained reaction product is dissolved in chloroform, extracted with methanol, filtered and thereafter further dried after being washed in pure water and methanol to thereby obtain a photoresponsive macromolecule A1.

(Synthesis of a Photoresponsive Macromolecule B1)

A photoresponsive macromolecule B1 such that X in the structural formula 7 is —CH$_3$, a1 is 0.5 (molar ratio), a2 is 0.5 (molar ratio) and the weight-average molecular weight is 23000 is synthesized as a photoresponsive macromolecule in the following manner.

First, in the synthesis of a side chain monomer used for synthesizing a photoresponsive macromolecule A1, a side chain monomer composing a side chain portion of a photoresponsive macromolecule A1 is obtained in the same manner as the synthesis of a side chain monomer used for synthesizing a photoresponsive macromolecule A1 except for replacing 4-hydroxy-4'-trifluoromethyl azobenzene with 4-hydroxy-4'-methyl azobenzene.

Then, a photoresponsive macromolecule B1 is synthesized in the same manner as the case of synthesizing a photoresponsive macromolecule A1 except for using this side chain monomer.

(Synthesis of a Photoresponsive Macromolecule B2)

A photoresponsive macromolecule B2 such that X in the structural formula 7 is —CN, a1 is 0.5 (molar ratio), a2 is 0.5 (molar ratio) and the weight-average molecular weight is 22000 is synthesized as a photoresponsive macromolecule in the following manner.

First, in the synthesis of a side chain monomer used for synthesizing a photoresponsive macromolecule A1, a side chain monomer composing a side chain portion of a photoresponsive macromolecule A1 is obtained in the same manner as the synthesis of a side chain monomer used for synthesizing a photoresponsive macromolecule A1 except for replacing 4-hydroxy-4'-trifluoromethyl azobenzene with 4-hydroxy-4'-cyano azobenzene.

Then, a photoresponsive macromolecule B2 is synthesized in the same manner as the case of synthesizing a photoresponsive macromolecule A1 except for using this side chain monomer.

Production of a Recording Medium

Example 1

Production of a Recording Medium 1

A photoresponsive macromolecule A1: 44.95 parts by mass

A reactive liquid crystal monomer (UCL008, manufactured by DAINIPPON INK AND CHEMICALS, INCORPORATED): 55 parts by mass A photopolymerization initiator (Irgacure784, manufactured by CHIBA SPECIALTY CHEMICALS): 0.05 part by mass Solution (a solid content concentration of 10% by weight) in which the above components are mixed and dissolved in THF (tetrahydrofuran) is applied on one face of a washed disk-shaped glass substrate (a diameter of 50 mm, a thickness of 1 mm) by spin coat, thereafter dried and formed into a recording layer having a film thickness of 2 μm to thereby obtain a recording medium 1.

Comparative Example 1

Production of a Recording Medium 2

A recording medium 2 is obtained in the same manner as Example 1 except for replacing a photoresponsive macromolecule A1 with a photoresponsive macromolecule B1.

Comparative Example 2

Production of a Recording Medium 3

A recording medium 3 is obtained in the same manner as Example 1 except for replacing a photoresponsive macromolecule A1 with a photoresponsive macromolecule B2.

<Evaluation of Permeability>

Permeability is evaluated in the following manner. First, a recording medium is irradiated with YAG laser (wavelength: 532 nm, intensity: 0.4 W/cm$^2$) from the direction perpendicular to a face on which a recording layer of the recording medium is provided. On this occasion, intensity of laser light which penetrates through the recording medium is measured by a power meter disposed on the side on which a recording layer of the recording medium is not provided. Then, when intensity of laser light in using a reference disk (a disk-shaped glass substrate used for producing a recording medium) is regarded as a standard (100%), relative intensity of the measured intensity of laser light through the recording medium is calculated as permeability. The results are shown in Table 2.

<Evaluation of Birefringence>

—Evaluation Equipment—

Figure 2:
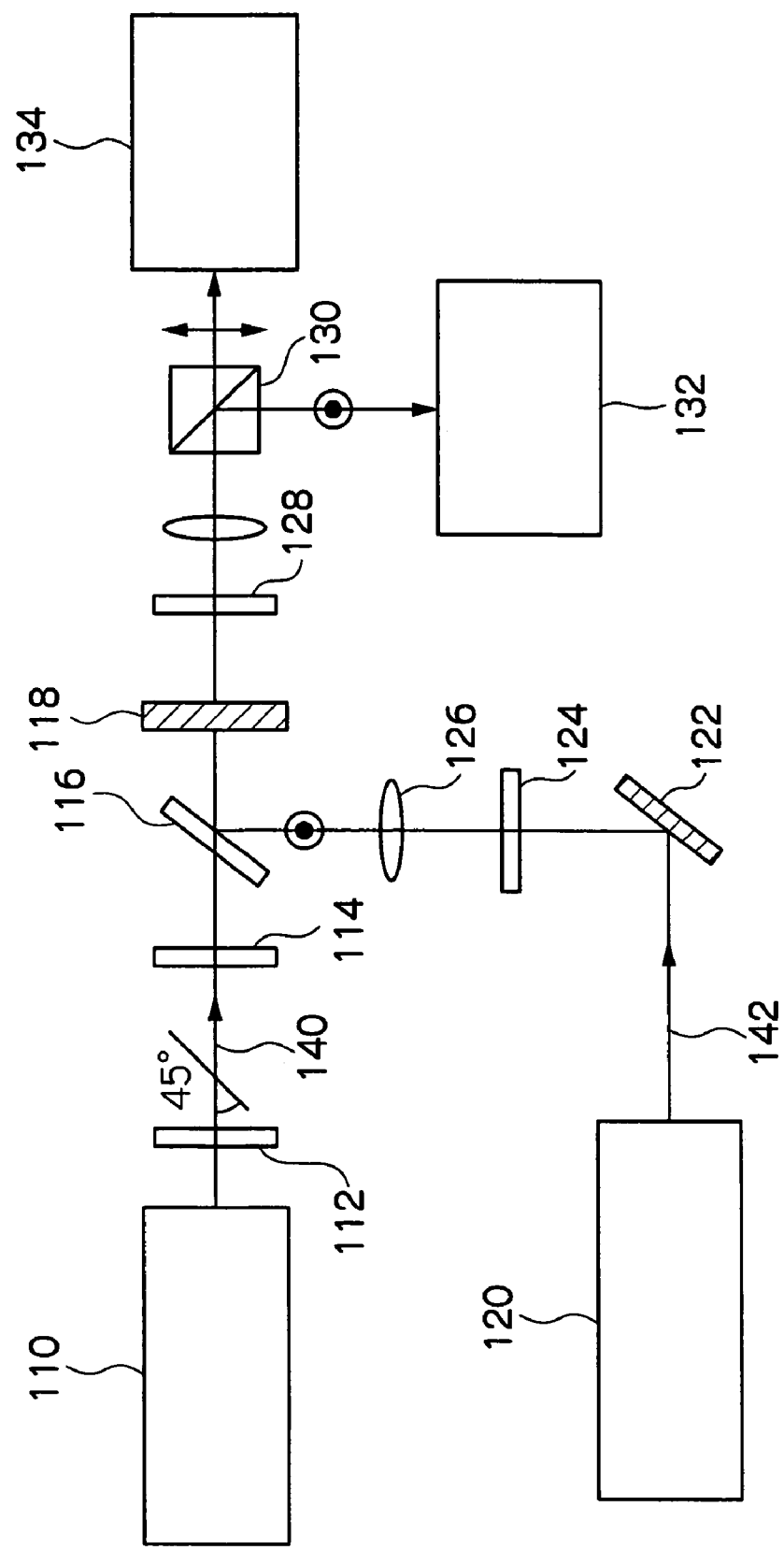
FIG. 2 is a schematic view showing an optical system utilized for evaluation of a recording medium.

With regard to sensitivity of a recording medium, birefringence by linearly polarized light irradiation is measured by utilizing an optical system shown in FIG. 2 to calculate rate of change in the energy dependence as the sensitivity. FIG. 2 is a schematic view showing an optical system utilized for birefringence evaluation of a recording medium. In FIG. 2, 110 represents an argon ion laser (a wavelength of 515 nm), 112 represents a half-wave plate, 114 represents a pinhole (a diameter of 1 mm), 116 represents a half mirror, 118 represents a recording medium, 120 represents a helium-neon laser (a wavelength of 633 nm), 122 represents a mirror, 124 represents a half-wave plate, 126 represents a lens, 128 represents an interference filter, 130 represents a polarizing beam splitter and 132, 134 represent power meters.

The measurement of the optical recording medium 118 by using the optical system shown in FIG. 2 is performed in the following manner. First, linearly polarized light (a wavelength of 515 nm) to which a photoresponsive macromolecule and a photopolymerization initiator contained in a recording layer of the recording medium 118 have sensitivity is made to enter as recording light 140 from the argon ion laser 110 through the half-wave plate 112, the pinhole 114 and the half mirror 116.

Linearly polarized light having a wavelength of 633 nm is made to enter as probe light at an angle of 45° with the polarization axis from the helium-neon laser 120 through the mirror 122, the half-wave plate 124, the lens 126 and the half mirror 116. The laser light, which penetrates through the recording medium 118, passes through the interference filter 128 and is separated into polarization components whose polarization directions are orthogonal to each other in the polarizing beam splitter 130, and optical output of each of the polarization components is measured in the two power meters 132, 134. Here, birefringence change is calculated from the polarization state of penetrating light by using measured values with the two power meters 132, 134.

—Evaluation—

The recording medium is irradiated with polarized light of the argon laser (wavelength: 515 nm), and simultaneously irradiated with the He—Ne laser light (wavelength: 633 nm) at polarization of 45° with the polarization direction of the argon laser. On this occasion, change in the polarization state of the He—Ne laser light before and after penetrating through the recording medium is detected by using the measured values with the power meters to calculate birefringence change.

Here, light irradiation is continued at an argon laser light output of 0.5 W/cm$^2$ at polarization of 45° with the He—Ne laser light as probe light 142 simultaneously irradiated until birefringence is saturated. Then, change in birefringence with respect to light irradiation time on this occasion is measured to calculate a value (the maximum birefringence) at a point of time when birefringence is saturated and light irradiation time to reach half birefringence of the maximum birefringence. The results are shown in Table 2.

TABLE 2

| | A photoresponsive macromolecule X in the structural formula 7 | Permeability (%) | The maximum birefringence | Light irradiation time to reach half birefringence of the maximum birefringence (s) |
|---|---|---|---|---|
| Example 1 | —$CF_3$ | 96 | 0.03 | 150 |
| Comparative Example 1 | —$CH_3$ | 97 | 0.01 | 33 |
| Comparative Example 2 | —CN | 93 | 0.03 | 150 |

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A hologram recording material comprising:

a molecule having intrinsic birefringence;

a photoresponsive macromolecule represented by the following formula:

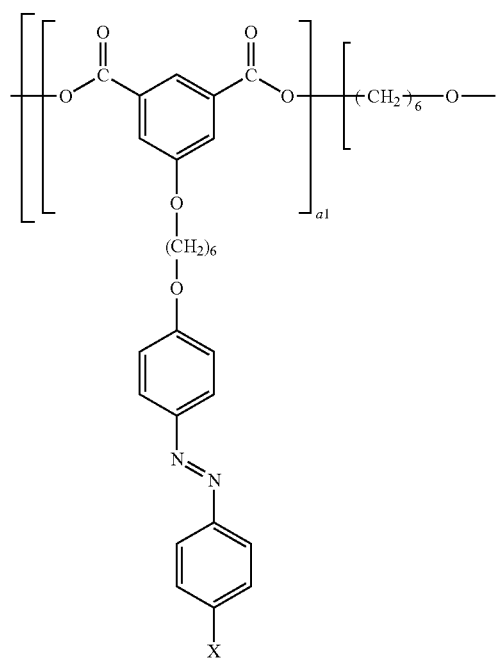

-continued

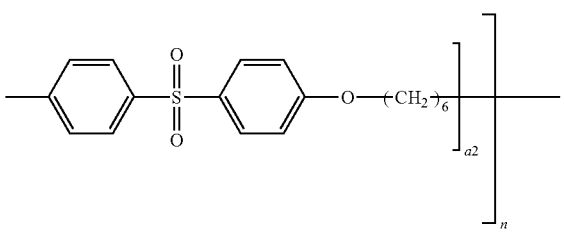

wherein, in the formula, X is selected from the group consisting of —$CF_3$, —F, —Cl, —Br, —I, —$OCF_3$ and —$SCF_3$, the maximum absorption wavelength of an azobenzene group bonding to X is approximately 360 nm or less, n represents an integer of 1 or more, and a1 and a2 signify molar ratios satisfying a relation of a1+a2=1 when a1 is in a range of from more than 0 to 1, and a2 is in a range of from 0 to less than 1; and a photopolymerization initiator present in an amount of approximately 0.08% by weight or less relative to the hologram recording material, the photopolymerization initiator promotes a reaction of the reactive molecule having an intrinsic birefringence that is either, or both of, polymerization and crosslinking, wherein the molecule having intrinsic birefringence is a reactive liquid crystal molecule.

2. The hologram recording material according to claim 1, wherein, in the formula, X is a —$CF_3$ group.

3. The hologram recording material according to claim 1, wherein a content of the reactive molecule having intrinsic birefringence is in a range of from approximately 30% by weight to approximately 80% by weight.

4. The hologram recording material according to claim 3, wherein an absorption wavelength of the photopolymerization initiator is in a wavelength range of light utilized for recording information.

5. The hologram recording material according to claim 3, wherein a wavelength of the light utilized for recording information is in a range of from approximately 500 nm to approximately 550 nm.

6. A hologram recording material comprising:

a molecule having intrinsic birefringence;

a photoresponsive macromolecule represented by the following structural formula:

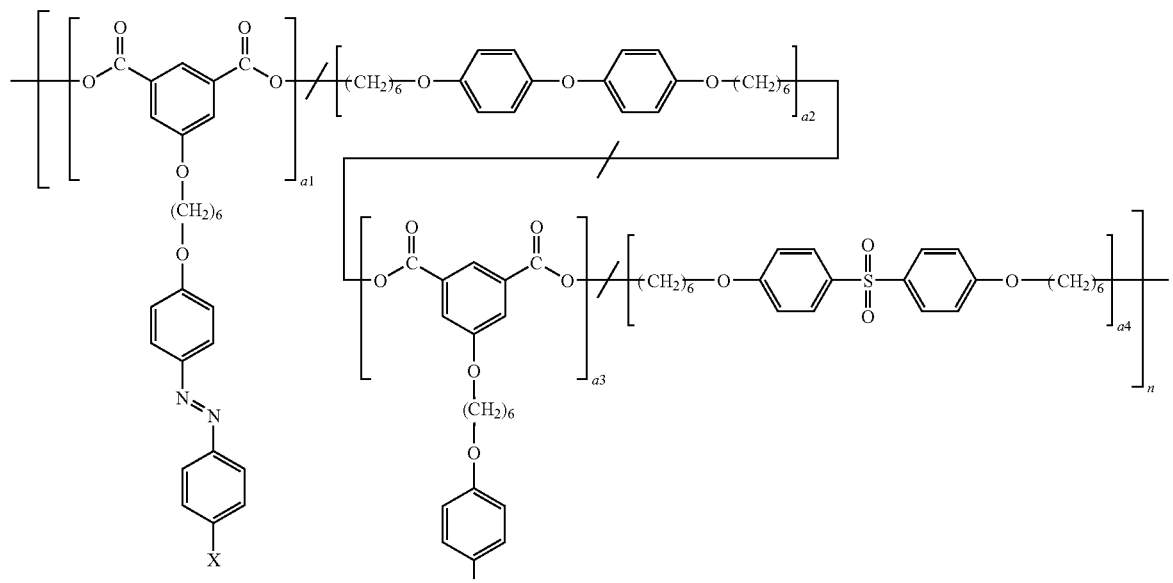

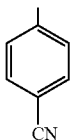

wherein, in the structural formula, X is selected from the group consisting of —CF$_3$, —F, —Cl, —Br, —I, —OCF$_3$ and —SCF$_3$, the maximum absorption wavelength of an azobenzene group bonding to X is approximately 360 nm or less, n represents an integer of 1 or more, a1, a2, a3 and a4 signify molar ratios satisfying a relation of a1+a2+a3+a4=1 when a1 is in a range of from more than 0 to 1, and a2, a3 and a4 are in a range of from 0 to less than 1; and a photopolymerization initiator present in an amount of approximately 0.08% by weight or less relative to the hologram recording material, the photopolymerization initiator promotes a reaction of the reactive molecule having an intrinsic birefringence that is either, or both of, polymerization and crosslinking, wherein the molecule having intrinsic birefringence is a reactive liquid crystal molecule.

7. A hologram recording medium comprising a recording layer formed from a hologram recording material according to claim 6.

8. A hologram recording method comprising recording information by simultaneously irradiating a hologram recording medium with a signal light and a reference light, and utilizing modulation of at least any one characteristic selected from the group consisting of amplitude, phase and polarization direction of light, the hologram recording medium comprising a recording layer made of a hologram recording material according to claim 6.

9. A hologram recording medium comprising:

a recording layer formed from a hologram recording material comprising a molecule having intrinsic birefringence;

a photoresponsive macromolecule represented by the following formula:

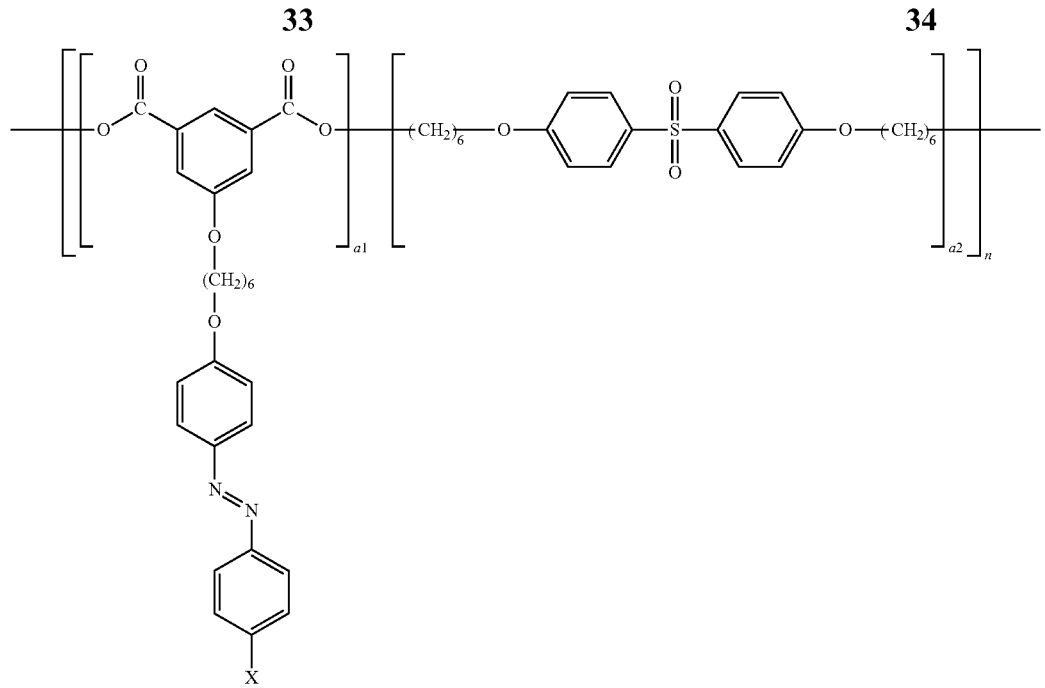

wherein, in the formula, X is selected from the group consisting of —CF$_3$, —F, —Cl, —Br, —I, —OCF$_3$ and —SCF$_3$, the maximum absorption wavelength of an azobenzene group bonding to X is approximately 360 nm or less, n represents an integer of 1 or more, and a1 and a2 signify molar ratios satisfying a relation of a1+a2=1 when a1 is in a range of from more than 0 to 1, and a2 is in a range of from 0 to less than 1; and a photopolymerization initiator present in an amount of approximately 0.08% by weight or less relative to the hologram recording material, the photopolymerization initiator promotes a reaction of the reactive molecule having an intrinsic birefringence that is either, or both of, polymerization and crosslinking, wherein the molecule having intrinsic birefringence is a reactive liquid crystal molecule.

10. The hologram recording medium according to claim 9, which is a volume hologram wherein a thickness of the recording layer is approximately 10 μm or more.

11. The hologram recording medium according to claim 9, which is a volume hologram wherein a thickness of the recording layer is approximately 200 μm or more.

12. A hologram recording method comprising recording information by simultaneously irradiating a hologram recording medium with a signal light and a reference light and utilizing modulation of at least any one characteristic selected from the group consisting of amplitude, phase and polarization direction of light, the hologram recording medium comprising:
a recording layer made of a hologram recording material containing a molecule having intrinsic birefringence;
a photoresponsive macromolecule represented by the following formula:

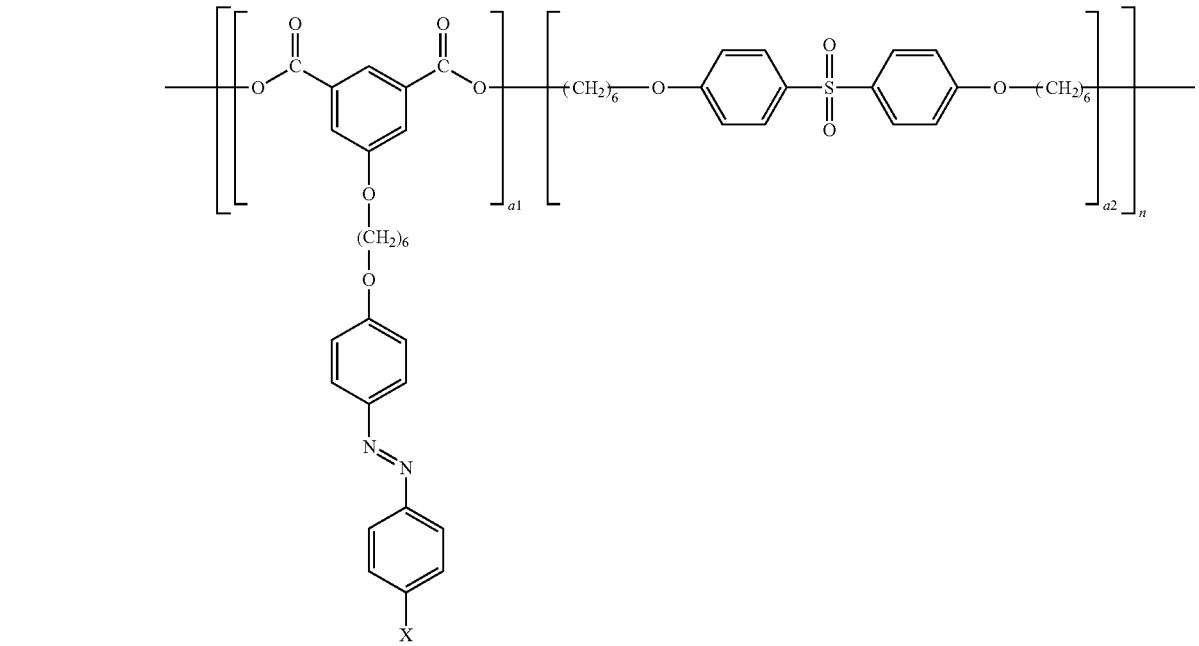

wherein, in the structural formula, X is selected from the group consisting of $-CF_3$, $-F$, $-Cl$, $-Br$, $-I$, $-OCF_3$ and $-SCF_3$, the maximum absorption wavelength of an azobenzene group bonding to X is approximately 360 nm or less, n represents an integer of 1 or more, and a1 and a2 signify molar ratios satisfying a relation of a1+a2=1 when a1 is in a range of from more than 0 to 1, and a2 is in a range of from 0 to less than 1; and a photopolymerization initiator present in an amount of approximately 0.08% by weight or less relative to the hologram recording material, the photopolymerization initiator promotes a reaction of the reactive molecule having an intrinsic birefringence that is either, or both of, polymerization and crosslinking, wherein the molecule having intrinsic birefringence is a reactive liquid crystal molecule.

13. The hologram recording method according to claim 12, wherein a content of the reactive molecule having intrinsic birefringence is in a range of from approximately 30% by weight to approximately 80% by weight, and recording of the information is performed by utilizing modulation of polarization direction of light.

14. The hologram recording method according to claim 13, in which the recording of the information is multiple recording.

* * * * *